United States Patent [19]

Quinlan

[11] Patent Number: 4,888,303
[45] Date of Patent: Dec. 19, 1989

[54] VAPOR PHASE EPITAXY-HYDRIDE TECHNIQUE WITH A CONSTANT ALLOY SOURCE FOR THE PREPARATION OF INGAAS LAYERS

[75] Inventor: Kenneth P. Quinlan, Newton, Mass.

[73] Assignee: The United States of America as represented by the Secretary of the Air Force, Washington, D.C.

[21] Appl. No.: 269,225

[22] Filed: Nov. 9, 1988

[51] Int. Cl.$^4$ .............................. H01L 21/20
[52] U.S. Cl. ..................... 437/81; 427/253; 156/614; 437/110; 437/949
[58] Field of Search .............. 148/DIG. 22, 29, 56, 148/65, 110, 119; 156/610–615; 427/252, 253, 255; 437/81, 110, 112, 926, 949, 971

[56] References Cited

U.S. PATENT DOCUMENTS

| | | | |
|---|---|---|---|
| 4,147,571 | 4/1979 | Stringfellow et al. | 437/128 |
| 4,407,694 | 10/1983 | Eu et al. | 156/613 |
| 4,689,094 | 8/1987 | Van Rees et al. | 437/104 |
| 4,729,968 | 3/1988 | Karlicek, Jr. | 437/81 |
| 4,801,557 | 1/1989 | Wessels et al. | 437/81 |
| 4,808,551 | 2/1989 | Mori et al. | 437/81 |

OTHER PUBLICATIONS

Tu et al., "Effects of Varying The Input and Downstream HCl . . . Hydride Growth of Int.," J. Crys. Growth, 70 (1984), pp. 117–122.
Quinlan et al., "Formation . . . of $Ga_xIn_{l-x}As$ In the VPE-Hydride . . . Hydrogen Chloride Etc.", J. Crys. Growth, 71 (1985), pp. 246–248.
Jones et al., ". . . Lattice Matching of InGaAs to InP," J. Crys. Growth, 70 (1984), pp. 127–132.
Pogge et al. "Doping Behavior of Silicon in Vapor—Growth III-V Epitaxial Film," J. Crys. Growth, 31 (1975), pp. 183–189.

Primary Examiner—Brian E. Hearn
Assistant Examiner—William Bunch
Attorney, Agent, or Firm—Stanton E. Collier; Donald J. Singer

[57] ABSTRACT

A continouous process of forming an epitaxial layer of InGaAs using a vapor phase epitaxial-hydride technique having a pressure controlled source of hydrogen chloride gas to maintain a partial pressure of the gas as a function of time as the amount of gallium is depleted from the alloy source melt of Ga/In during the growth of the epitaxial layer.

1 Claim, 1 Drawing Sheet

VAPOR PHASE EPITAXY-HYDRIDE TECHNIQUE WITH A CONSTANT ALLOY SOURCE FOR THE PREPARATION OF INGAAS LAYERS

STATEMENT OF GOVERNMENT INTEREST

The invention described herein may be manufactured and used by or for the Government for governmental purposes without the payment of any royalty thereon.

BACKGROUND OF THE INVENTION

The present invention relates in general to a process for depositing epitaxial films of Group III-V semiconductor on a substrate crystallographically compatible therewith. In a more particular aspect, this invention relates to a continuous process for depositing an epitaxial film of a ternary III-V compound by a vapor phase epitaxy-hydride technique using a binary III-V alloy as the metallic source.

Epitaxial films composed of semiconductor containing elements from group III and group V of the Periodic Table of Elements are major components in the fabrication of optoelectronic and microwave devices. These devices provide the foundation for future advances in the area of optical communication and radar technology. Consequently, a considerable research effort has evolved in an attempt to provide more useful and efficient III-V compounds of high quality. Laser, photodetectors and transistors are examples of devices used in optical communication systems and radar technology; the III-V semiconductor films —substrates are the basic structures used in the fabrication of such devices. The use of high quality III-V semiconductors of good morphology with defect-free surfaces contributes significantly to an overall improvement in the efficient operation and extended lifetime of lasers and photodetectors, thus increasing the efficiency and reliability of communication systems.

The III-V epitaxial structures and semiconductor applications, such as those employed in the fabrication of optical communication and radar systems generally include the arsenides, antimonides, phosphides and nitrides of aluminum, gallium or indium, as well as ternary and quaternary mixtures thereof. These compounds, in general, are deposited as crystalline films on semiconductor substrates by either vapor phase or liquid phase epitaxial techniques.

In vapor phase epitaxy, a number of specific processes are known for effecting the deposition of III-V films. These processes usually include the steps of reacting two gaseous mixtures within an enclosed reaction chamber to provide a III14 V compound. The two gaseous mixtures generally utilized in vapor phase epitaxy comprise as one of them, a first gaseous mixture formed by contacting a Group III element with hydrogen halide; while the other, or second gaseous mixture, is formed by mixing hydrogen, as a carrier gas, with a Group V element in gaseous form. The III-V compound resulting from the interaction of the two gaseous mixtures is then deposited as an epitaxial film onto a suitable semiconductor substrate. The semiconductor substrate may be similar or different than the material used to form the epitaxial films and generally include III-V compounds, II-VI compounds, as well as silicon and germanium.

Unfortunately, the growth of III-V ternary compounds, especially the preparation of the InGaAs, InGaP and InGaSb ternary alloys is difficult and the resulting crystalline films lack good morphological characteristics and often possess a high number of impurities. The defects produced during the growth of epitaxial films of the above type originate from a number of sources, e.g., dislocation on the substrate, inappropriate epitaxial growth conditions, and the presence of foreign matter of impurities during the growth process.

One of the better known methods for producing III-V compounds is referred to as the vapor phase epitaxial-hydride technique (VPE-Hydride). The specific details of this technique are set forth in a review paper by G. H. Olsen and T. J. Zamerowski, "Crystal Growth and Properties of Binary, Ternary and Quaternary (In, Ga) (As, P) Alloys grown by the Hydride Vapor Phase Epitaxy Technique", B.R. Pamplin (ed): Progress in Crystal Growth and Characterization, Vol. II, Pergamon Press Ltd., London (1981), pp 309-375.

In one prior technique, a double barrel quartz reactor tube was necessary to grow the III-V ternary thin films. In those reactors, each barrel contained a boat of the individual group III elements. An additional inlet was necessary for the group V hydride.

In another prior technique, the vapor phase epitaxy-hydride technique used a binary alloy such as gallium and indium, as the metallic source for that technique. The utilization of a binary alloy metal source in order to effect the growth of a ternary alloy layer promotes the formation of an epitaxial film with good morphological characteristics and fewer defects than had been achieved heretofore. The group III binary alloy metal source is placed in a quartz container or boat which in turn is placed within a single barrel quartz reactor where it reacts with hydrogen chloride flowing over the alloy to form chlorides of the group III elements, such as InCl and GaCl.

The group V source, in the form of a gaseous hydride such as arsine ($AsH_3$), phosphine ($PH_3$) or stibine ($SbH_3$), then reacts with the chlorides in the mixing zone of the reactor to from III-V ternary compounds as the epitaxial films on the surfaces of a suitable semiconductor substrate, such as InP in the deposition zone of the reactor.

U.S. Pat. 4,504,329 is incorporated by reference. The preparation of lattice matched $In_{0.53}Ga_{0.47}As$ by this technique have raised questions about the interrelationship between compositions, pressure and temperature and their effect on the quality of the lattice matched $In_{0.53}Ga_{0.47}As$ layer.

SUMMARY OF THE INVENTION

The present invention sets forth a continuous VPE-hydride technique for forming a layer of $In_{0.53}Ga_{0.47}As$.

It has been found that, in particular, $In_{0.53}Ga_{0.47}As$ can be deposited by a modified VPE-hydride technique where the partial pressure of HCl is varied during the process to adjust for changing alloy composition of the source.

A larger partial pressure of hydrogen chloride, HCl, is required to prepare $In_{0.53}Ga_{0.47}As$ when the starting alloy of Ga/In contains a smaller percentage of Ga than when the alloy contains larger amounts of Ga. The initial partial pressure of HCl changes when the initial alloy composition is changed and as the process continues, the partial pressure must be changed as the alloy composition changes when the Ga/In is removed by the reactants.

The above process takes place in a single tube quartz reactor.

Therefore, one object of the present invention is to provide a continuous vapor phase epitaxy (VPE)-hydride process for depositing a layer of ternary semiconductor material;

Another object of the present invention is to provide a continuous VPE-hydride process wherein the partial pressure of HCl is varied as the composition of the melt alloy changes.

Another object of the present invention is to provide continuous VPE-wherein the process of depositing a layer of InGaAs minimizes time and more efficiently uses materials available.

These and many other objects and advantages of the present invention will be readily apparent to one skilled in the pertinent art from the following detailed description of a preferred embodiment of the invention related drawings.

DETAILED DESCRIPTION OF THE PREFERRED EMBODIMENT

Figure 1:
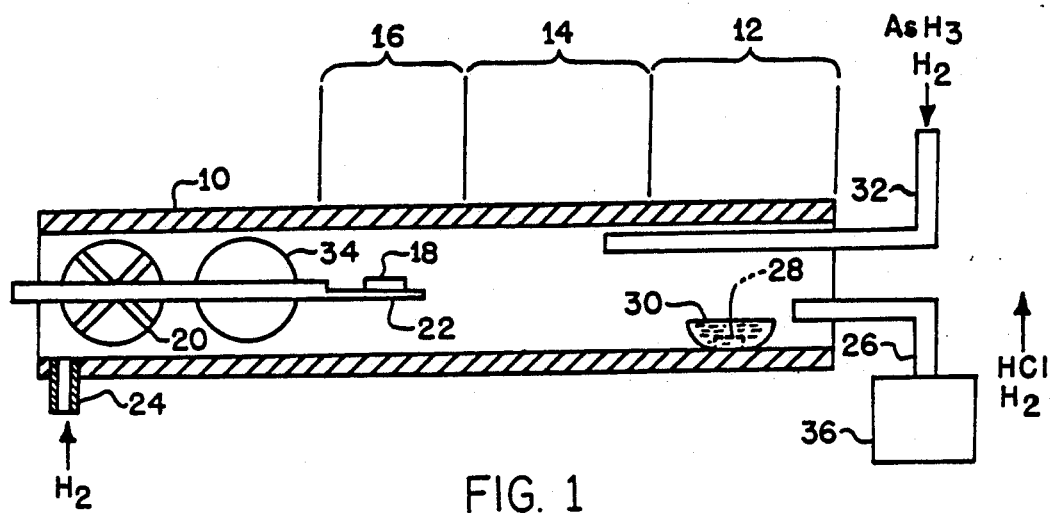
FIG. 1 illustrates in schematic form the reactor for the improved VPE-hydride technique.

In order to illustrate how the present invention is carried into effect, reference is made to FIG. 1 which discloses a three-zone vapor phase growth apparatus suitable for use with this invention. The apparatus comprises an elongated quartz tube 10 divided into three temperature zones: a source zone 12, a mixing zone 14 and a deposition zone 16. These zones are heated to their desired or predetermined temperature by means of a conventional "claim shell" resistance heater, not shown. A semiconductor substrate 18 of suitable composition, such as an iron doped-indium phosphide wafer cut 2 degrees from the (100) plane toward the (110) plane, is placed in a substrate holder 22 and then the substrate and holder are introduced into the forechamber located adjacent gas inlet 24 of the reactor 10. The substrate is then flushed with an inert gas, e.g., hydrogen or nitrogen. The inert gas enters through gas inlet 24 and exits through a port not shown. After flushing, the substrate and holder are further introduced into the reactor 10 through entry port 20 and positioned within the deposition zone 16 maintained at a predetermined temperature of about 700° C.

A first gaseous mixture containing hydrogen chloride and a hydrogen carrier gas is then introduced into the source zone 12 by means of gas inlet 26 in a controlled manner by gas mass flow controllers 36. The source zone 12 is usually maintained at a temperature of about 800° C. in order to effect a reaction between the gaseous mixture and the indium gallium Group III binary alloy metal source 28. The indium/gallium alloy is prepared by adding the exact amounts of indium and gallium to give a desired composition as, for example, noted in FIG. 2. Metal source 28 is positioned in a quartz boat or container 30 which, in turn, is located within the source zone 12.

The mixture of hydrogen chloride and hydrogen from inlet 26 passes over the indium/gallium alloy 28 located in crucible 30 where the hydrogen chloride reacts with the indium to form indium chloride (InCl) and the gallium to form gallium (GaCl). The group V hydride, such $AsH_3$, $PH_3$ or $SbH_3$, is mixed with hydrogen gas and enters through inlet 32 and is decomposed by heat to the active species in the mixing zone 14 of the reactor. These active species are $As_2$, $As_4$, etc. The active species of the group V hydride react with the chlorides of the group III element at the surface of the substrate 18 in the deposition zone 16 to form epitaxial layers of the group III-V compounds contemplated by this invention.

In order to use the above apparatus as intended by the present invention, it was determined by an equilibrium analysis that the composition of the ternary is not only dependent on $P_{As_4}{}^o$ and the alloy concentration but also on $P_{HCl}{}^o$ at constant source and deposition temperatures. Therefore, at any one alloy composition values of $P_{HCl}{}^o$ and $P_{As_4}{}^o$ exist where $In_{0.53}Ga_{0.47}As$ may be prepared.

Since the equilibrium analysis described the various experimental data, calculations were undertaken to predict the effect of varying the PHCl with various alloy compositions on the ternary composition. These calculations were performed at constant $P_{As_4}{}^o$ ($2.5 \times 10^{-3}$ atm), source temperature (800° C.) an deposition (675° C.). The values of $P_{HCl}{}^o$ ranged from $1 \times 10^{-3}$ to $8 \times 10^{-3}$ atm. The analysis shows that the gallium arsenide increases in the ternary with increasing $P_{HCl}{}^o$ at any one alloy composition. The rate of change in GaAs concentration is greater with increasing $P_{HCl}{}^o$ for alloys containing higher amounts of gallium. The analysis also indicated that greater amounts of $P_{HCl}{}^o$ are required to prepare $In_{0.53}Ga_{0.47}As$ with alloys containing smaller percentage of gallium. These calculated trends are validated from the experimental data of the various investigators, e.g., the trend of requiring more prepare $In_{0.53}Ga_{0.47}As$ agreed with the experimental results.

For example, a partial pressure of $2.3 \times 10^{-3}$ atm for HCl is required when there is a 11.8 a/o alloy while a pressure of $5.0 \times 10^{-3}$ atm is needed for a 7 atomic % gallium alloy.

Experimental studies on the preparation of $In_{0.53}Ga_{0.47}As$ with the same alloy composition showed that the gallium content in the Ga-In alloy decreased with continuous operation. This loss of gallium in the alloy can now be compensated by increasing the partial pressure of hydrogen chloride to maintain the $In_{0.53}Ga_{0.47}As$. Thus, This invention alleviates the problem of replacing the gallium in the alloy when a constant $P_{HCl}{}^o$ is used.

This analysis is reported by the inventor in the article "Equilibrium Analysis of the VPE-Hydride Method Using a Gallium-Indium Alloy Source," Journal of The Electrochemical Society, Vol, 135, No.8, August, 1988, pp 2108 to 2110. Varying the partial pressures of the other gases does not relate as the above to this invention.

Figure 2:
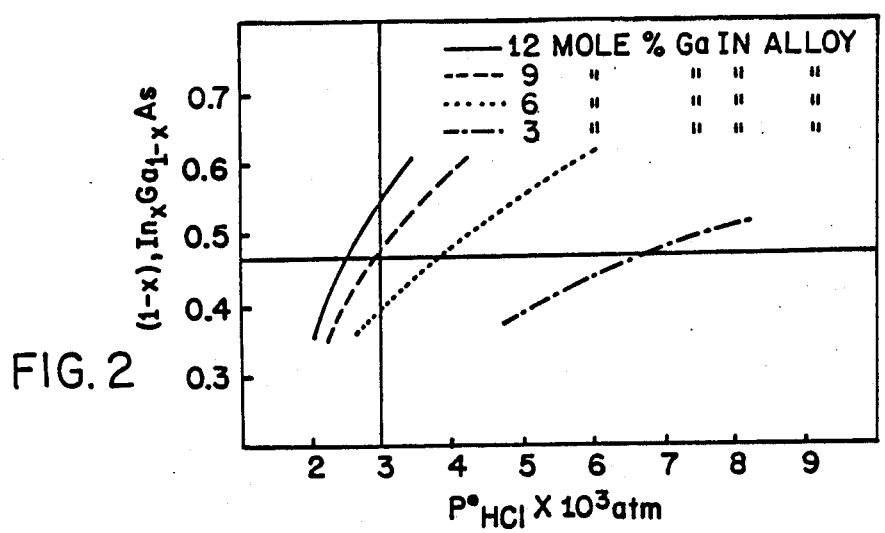
FIG. 2 illustrates by diagram the mole fraction of GaAs in InGaAs as a function of the initial partial pressure of hydrogen chloride ($P^o_{HCl}$).

FIG. 2 shows that $In_{0.53}Ga_{0.47}As$ can be prepared with any one alloy by varying the $P_{HCl}{}^o$ from an initial value. One can see that larger amounts of hydrogen chloride are need to prepare $In_{0.53}Ga_{0.47}As$ with alloys containing larger percentages of gallium than with alloys containing larger amount of Ga. Table 1 gives the values of $P_{HCl}{}^o$ to prepare $In_{0.53}Ga_{0.47}As$ at four alloy compositions.

TABLE 1

Initial Partial Pressures of HCl Required for the Preparation of $In_{0.53}Ga_{0.47}As$ with Various Alloy Compositions

| Alloy Compositions (Ga atomic % in alloy) | $P^o_{HCl}$ (atm) |
| --- | --- |
| 3 | $6.8 \times 10^{-3}$ |
| 6 | $3.9 \times 10^{-3}$ |
| 9 | $3.0 \times 10^{-3}$ |
| 12 | $2.6 \times 10^{-3}$ |

Figure 3:
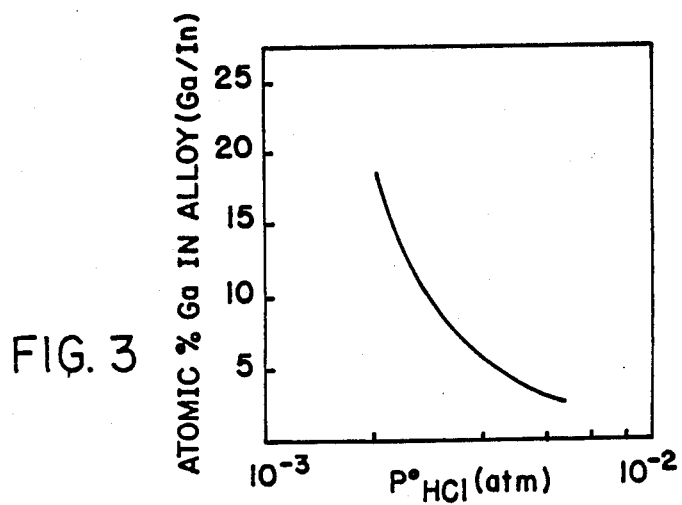
FIG. 3 illustrates by diagram calculated initial partial pressures of hydrogen chloride to make $In_{0.53}Ga_{0.47}As$ at various alloy compositions.

The results presented in Table 1 were obtained at a deposition temperature of 675° C. and a source temperature of 800° C. Various temperature combinations can be used. FIG. 3 shows the amounts of $P_{HCl}{}^o$ needed to prepare $In_{0.53}Ga_{0.47}As$ a function of the alloy composition. The data presented in FIG. 3 can be used to adjust the partial pressure of hydrogen chloride ($P_{HCl}{}^o$) necessary to prepare $In_{0.53}Ga_{0.47}As$ during a continuous operation.

In FIG. 3, the curve shown was calculated with $P_{As_4}{}^o = 2.5 \times 10^{-3}$ atm, source temperature of 800° C. and a deposition temperature of 675° C.

When one alloy composition with one partial pressure of HC1 is used in a continuous operation, the gallium concentration of the alloy decreases resulting in a ternary having a smaller mole function of gallium arsenide. FIG. 3 shows that the composition of the ternary can be maintained at $In_{0.53}Ga_{0.47}As$ by increasing the $P_{HCl}{}^o$, e.g., an alloy having 10 atomic % gallium requires $2.8 \times 10^{-3}$ atm of HC1 to prepare $In_{0.53}Ga_{0.47}As$, when the gallium in the alloy decreases to 9.0 atomic %, an increase of HC1 to $3.0 \times 10^{-3}$ atm maintains the ternary at $In_{0.53}Ga_{0.47}As$.

The determination of the atomic percentage of gallium remaining in source 28 as a function of time in the continuous technique is empirically determined and this would be applied to FIG. 3 to adjust the partial pressure of HC1.

Clearly, many modifications and variations of the present invention are possible in light of the above teachings and it is therefore understood, that within the inventive scope of the inventive concept, the invention may be practiced otherwise than specifically claimed.

What is claimed is:

1. A method for continuously preparing and depositing an epitaxial crystalline film comprised of a III-V compound onto the surface of a suitable substrate crystallographically compatable with said film, said method comprising the steps of:

(A) positioning a substrate suitable for epitaxial growth of III-V compounds on the surface thereof in a first zone located at one end of a reaction chamber while maintaining said first zone at a predetermined temperature of about 700° C;

(B) positioning a binary metal alloy source material composed of gallium and indium of a predetermined initial composition in a second zone located at the other end of said chamber while maintaining said second zone at a predetermined temperature of about 800° C;

(C) introducing a gaseous mixture composed of (a) hydrogen chloride and (b) a carrier gas into said heated second zone and passing said hydrogen chloride gas mixture over said binary metal alloy source material to produce a first gaseous reactant mixture formed by the reaction between said hydrogen chloride and said binary metal alloy source material; said hydrogen chloride gas having an initial partial pressure being determined by the gallium atomic percent in the alloy source material and further being determined by the composition of the epitaxial film to be deposited;

(D) introducing said first gaseous reactant mixture into a third zone of said chamber, said third zone being maintained at a predetermined temperature of about 850° C. and positioned intermediate said first and second zones;

(E) introducing a second gaseous reactant into said third zone simultaneously with the entry of said first gaseous reactant mixture into said third zone, said second gaseous reactant comprising a mixture of (a) a hydride selected from the group consisting of phosphine, arsine, and stibine and (b) an inert carrier gas to form an admixture between said first gaseous reactant mixture and said second gaseous reactant;

(F) introducing said admixture into said heated first zone and contacting said substrate to affect the deposition of ternary epitaxial crystalline film thereof; and (G) adjusting continuously as a function of time the partial pressure of HC1 gas to maintain the predetermined composition of the epitaxial layer as the gallium is depleted from the alloy source material.

* * * * *

UNITED STATES PATENT AND TRADEMARK OFFICE
CERTIFICATE OF CORRECTION

PATENT NO. : 4,888,303

DATED : December 19, 1989

INVENTOR(S) : Kenneth P. Quinlan

It is certified that error appears in the above-identified patent and that said Letters Patent is hereby corrected as shown below:

In Col. 1, line 51, delete "14" and insert -- - --, being a dash, therein.

The el in "HCl" or "GaCl" or "InCl" has been highlighted almost throughout thus appearing as a one. The el should not be highlighted at the following locations: Col. 2, lines 57, 60 and 64; Col. 3, line 9; Col. 4, lines 4, 5, 25 and 44; Col. 5, lines 26, 32, 34 and 40; Col. 6, line 46.

In Col. 4, line 25, delete "PHCl and insert -- $P_{HCl}$ -- therein.

The initial partial pressure "P⁰" is incorrectly shown with the superscript "o" not placed on the "P". See Table 1 for correct form.

Col. 3, line 27, delete "$P_H{}^oCl$" and insert -- $P^o_{HCl}$ -- therein.

Delete "$P_{As4o}$" and insert -- $P^o_{As4}$ -- at the following locations: Col. 4, lines 18, 21 and 27; Col. 5, line 23.

Delete "$P_{HCl}o$ and insert -- $P^o_{HCl}$ -- at the following, locations: Col. 4, lines 19, 21, 29, 32, 33, 35, 54, 63 and 68.

In Col. 4, line 27, delete "AS" and insert -- As -- therein.

In Col. 4, line 51, delete "AS" and insert -- As -- therein.

In Col. 4, line 52, delete "This" and insert -- this -- therein.

UNITED STATES PATENT AND TRADEMARK OFFICE
CERTIFICATE OF CORRECTION

PATENT NO. : 4,888,303

DATED : December 19, 1989

INVENTOR(S) : Kenneth P. Quinlan

It is certified that error appears in the above-identified patent and that said Letters Patent is hereby corrected as shown below:

In Col. 5, line 17, insert -- as -- before "a function".

Signed and Sealed this

Twenty-fifth Day of December, 1990

Attest:

HARRY F. MANBECK, JR.

*Attesting Officer*   *Commissioner of Patents and Trademarks*